(12) United States Patent
Nitta et al.

(10) Patent No.: US 12,389,532 B2
(45) Date of Patent: Aug. 12, 2025

(54) HIGH-FREQUENCY CIRCUIT

(71) Applicants: SUMITOMO ELECTRIC PRINTED CIRCUITS, INC., Koka (JP); SUMITOMO ELECTRIC INDUSTRIES, LTD., Osaka (JP)

(72) Inventors: Koji Nitta, Osaka (JP); Takafumi Uemiya, Osaka (JP); Suguru Yamagishi, Osaka (JP); Shigeki Shimada, Osaka (JP); Hiroshi Ueda, Osaka (JP); Satoshi Kiya, Koka (JP)

(73) Assignees: SUMITOMO ELECTRIC PRINTED CIRCUITS, INC., Koka (JP); SUMITOMO ELECTRIC INDUSTRIES, LTD., Osaka (JP)

(*) Notice: Subject to any disclaimer, the term of this patent is extended or adjusted under 35 U.S.C. 154(b) by 341 days.

(21) Appl. No.: 17/783,138

(22) PCT Filed: May 10, 2021

(86) PCT No.: PCT/JP2021/017769
§ 371 (c)(1),
(2) Date: Jun. 7, 2022

(87) PCT Pub. No.: WO2021/230215
PCT Pub. Date: Nov. 18, 2021

(65) Prior Publication Data
US 2023/0019563 A1  Jan. 19, 2023

(30) Foreign Application Priority Data
May 13, 2020  (JP) .................................. 2020-084545

(51) Int. Cl.
*H05K 1/02*   (2006.01)
*H01P 3/08*   (2006.01)
(Continued)

(52) U.S. Cl.
CPC ............ *H05K 1/0237* (2013.01); *H01P 3/08* (2013.01); *H05K 1/0215* (2013.01);
(Continued)

(58) Field of Classification Search
CPC .. H05K 1/0237; H05K 1/0215; H05K 1/0219; H05K 3/429; H05K 2201/09618;
(Continued)

(56) References Cited

U.S. PATENT DOCUMENTS 5,357,138 A    10/1994  Kobayashi
5,770,981 A    6/1998   Koizumi et al.
(Continued)

FOREIGN PATENT DOCUMENTS

JP    H04267586 A    9/1992
JP    H08-274513 A   10/1996
(Continued)

*Primary Examiner* — Ishwarbhai B Patel
(74) *Attorney, Agent, or Firm* — Oliff PLC

(57) ABSTRACT

A high-frequency circuit includes a first electric conductor layer, a first dielectric layer, a circuit layer, a second dielectric layer, a second electric conductor layer arranged in this order, and the circuit layer includes a ground pattern and a transmission line of a high-frequency signal. An electromagnetic wave shield is disposed around the transmission line. The electromagnetic wave shield includes a ground electric conductor on inner surfaces of a plurality of holes extending through the first dielectric layer, the ground pattern, the second dielectric layer, the first electric conductor layer, and the second electric conductor layer. The plurality of holes are a plurality of elongated holes provided at an interval in a direction in which the transmission line is surrounded. In each of the plurality of elongated holes, a longitudinal dimension in the direction in which the transmission line is surrounded is larger than a width dimension.

13 Claims, 7 Drawing Sheets

(51) Int. Cl.
*H05K 1/11* (2006.01)
*H05K 3/42* (2006.01)

(52) U.S. Cl.
CPC ........... *H05K 1/0219* (2013.01); *H05K 3/429* (2013.01); *H05K 1/0216* (2013.01); *H05K 1/0225* (2013.01); *H05K 1/0251* (2013.01); *H05K 1/11* (2013.01); *H05K 2201/09618* (2013.01)

(58) Field of Classification Search
CPC ......... H05K 2201/09609; H05K 2201/09854; H05K 1/0251; H05K 9/00; H01P 3/08; H01P 3/088; H01P 5/028
See application file for complete search history.

(56) References Cited

U.S. PATENT DOCUMENTS

| | | | |
|---|---|---|---|
| 5,828,555 A | 10/1998 | Itoh | |
| 6,353,189 B1* | 3/2002 | Shimada | H01L 23/49827 257/E23.105 |
| 6,523,252 B1* | 2/2003 | Lipponen | H01P 3/06 29/850 |
| 6,738,598 B2* | 5/2004 | Wu | H04B 7/18515 343/846 |
| 2003/0188889 A1* | 10/2003 | Straub | H05K 1/0219 174/262 |
| 2010/0259338 A1* | 10/2010 | Jow | H05K 1/0251 333/33 |
| 2011/0203843 A1 | 8/2011 | Kushta | |
| 2018/0108965 A1* | 4/2018 | Huang | H01P 3/006 |
| 2018/0288868 A1* | 10/2018 | Elsherbini | H01P 3/088 |
| 2019/0269007 A1 | 8/2019 | Sikina et al. | |

FOREIGN PATENT DOCUMENTS

| | | |
|---|---|---|
| JP | H10041630 A | 2/1998 |
| JP | 2003-152292 A | 5/2003 |
| JP | 2004112131 A | 4/2004 |
| JP | 2006067403 A | 3/2006 |
| JP | 2007060714 A | 3/2007 |
| JP | 2010-506380 A | 2/2010 |
| JP | 2014-011528 A | 1/2014 |
| JP | 2016-225513 A | 12/2016 |
| JP | 2018-200982 A | 12/2018 |
| JP | 2019029609 A | 2/2019 |
| JP | 2019-197785 A | 11/2019 |

* cited by examiner

HIGH-FREQUENCY CIRCUIT

TECHNICAL FIELD

The present disclosure relates to a high-frequency circuit.

The present application claims priority based on Japanese Patent Application No. 2020-084545 filed on May 13, 2020, and the entire contents of the Japanese patent application are incorporated herein by reference.

BACKGROUND ART

PTL 1 discloses a structure including multiple shield vias that are electrically connected to a front surface ground and a back surface ground of a dielectric substrate.

CITATION LIST

Patent Literature

PTL 1: Japanese Unexamined Patent Application Publication No. 8-274513

SUMMARY OF INVENTION

An aspect of the present disclosure provides a high-frequency circuit. The high-frequency circuit according to the present disclosure includes a first dielectric layer, a circuit layer disposed on the first dielectric layer and including a transmission line of a high-frequency signal and a ground pattern disposed around the transmission line, a second dielectric layer disposed such that the circuit layer is located between the first dielectric layer and the second dielectric layer, a first electric conductor layer disposed such that the first dielectric layer is located between the circuit layer and the first electric conductor layer, a second electric conductor layer disposed such that the second dielectric layer is located between the circuit layer and the second electric conductor layer, and an electromagnetic wave shield disposed around the transmission line. The electromagnetic wave shield includes a ground electric conductor on inner surfaces of a plurality of holes extending through the first dielectric layer, the ground pattern, the second dielectric layer, the first electric conductor layer, and the second electric conductor layer. The plurality of holes are a plurality of elongated holes provided at an interval in a direction in which the transmission line is surrounded. In each of the plurality of elongated holes, a longitudinal dimension in the direction in which the transmission line is surrounded is larger than a width dimension.

DESCRIPTION OF EMBODIMENTS

Problems to be Solved by Present Disclosure

Shield vias are formed by forming multiple through-holes each having a circular shape in plan view and extending through a dielectric substrate in the thickness direction of the dielectric substrate, and providing an electric conductor such as copper in the through-holes. The shield vias are used as an electromagnetic wave shield that prevents electromagnetic waves from leaking in the dielectric substrate.

Figure 7:
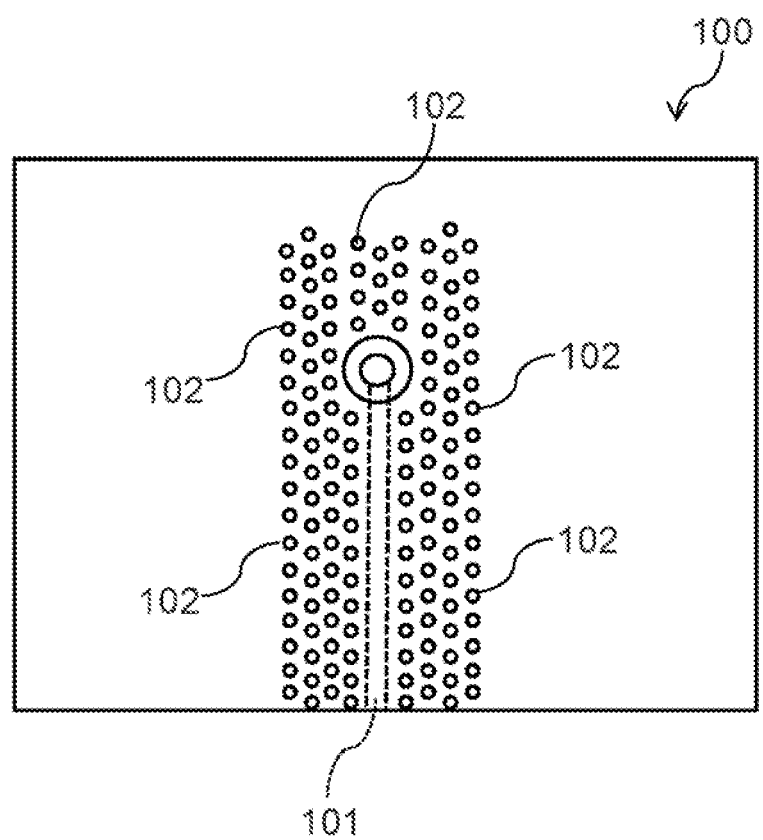
FIG. 7 is a plan view of a high-frequency circuit according to a comparative example.

FIG. 7 illustrates an example of the structure of a high-frequency circuit 100 having a signal transmission line 101, in which multiple shield vias 102 are formed so as to surround the signal transmission line 101. Unnecessary electromagnetic waves are radiated from the signal transmission line 101 of high-frequency waves. The electromagnetic waves are noise for peripheral circuits and deteriorate characteristics of the peripheral circuits.

When the multiple shield vias 102 are provided around the signal transmission line 101, the multiple shield vias 102 function as an electromagnetic wave shield. This electromagnetic wave shield can shield electromagnetic waves leaking from the signal transmission line 101.

However, the leakage of electromagnetic waves may occur from a gap between the shield vias 102. To more reliably prevent the leakage of electromagnetic waves, it is conceivable that a plurality of lines of shield vias 102 are arranged in parallel around the signal transmission line 101, as illustrated in FIG. 7. In this case, there occurs the problem that the number of the shield vias 102 is very large. If the number of the shield vias 102 is increased, a large number of holes for the shield vias 102 need to be formed, resulting in a decrease in the production efficiency of the circuit.

On the other hand, if the number of the shield vias 102 is reduced in view of the production efficiency of the circuit, electromagnetic waves tend to leak from a gap between the shield vias 102, and the shielding performance against electromagnetic waves is impaired.

Accordingly, it is desirable to efficiently prevent the leakage of electromagnetic waves.

Advantageous Effects of Present Disclosure

According to the present disclosure, the leakage of electromagnetic waves can be effectively prevented.

1. Description of Embodiment of Present Disclosure (1) A high-frequency circuit according to an embodiment includes a first dielectric layer, a circuit layer disposed on the first dielectric layer and including a transmission line of a high-frequency signal and a ground pattern disposed around the transmission line, a second dielectric layer disposed such that the circuit layer is located between the first dielectric layer and the second dielectric layer, a first electric conductor layer disposed such that the first dielectric layer is located between the circuit layer and the first electric conductor layer, a second electric conductor layer disposed such that the second dielectric layer is located between the circuit layer and the second electric conductor layer, and an electromagnetic wave shield disposed around the transmission line. Since the circuit layer is sandwiched between the first electric conductor layer and the second electric conductor layer, electromagnetic waves are prevented from leaking from the transmission line in a thickness direction of the high-frequency circuit. The electromagnetic wave shield includes a ground electric conductor on inner surfaces of a plurality of holes extending through the first dielectric layer, the ground pattern, the second dielectric layer, the first electric conductor layer, and the second electric conductor layer. The plurality of holes are a plurality of elongated holes provided at an interval in a direction in which the transmission line is surrounded, and in each of the plurality of elongated holes, a longitudinal dimension in the direction in which the transmission line is surrounded is larger than a width dimension. Since the holes in which the electromagnetic wave shield is formed are formed to be elongated in the direction in which the transmission line is surrounded, even when the number of holes is reduced, the leakage of electromagnetic waves can be efficiently prevented compared with the case where circular shield vias are provided.

(2) The longitudinal dimension is preferably more than five times larger than the width dimension. When the longitudinal dimension of each of the holes is more than five times larger than the width dimension of the hole, the hole is sufficiently elongated, and the leakage of electromagnetic waves can be efficiently prevented.

(3) The longitudinal dimension is preferably larger than the interval. When the longitudinal dimension of each of the holes is larger than the interval of the holes, the leakage of electromagnetic waves can be efficiently prevented.

(4) The longitudinal dimension is preferably more than five times larger than the interval. When the longitudinal dimension of each of the holes is more than five times larger than the interval of the holes, the leakage of electromagnetic waves can be efficiently prevented.

(5) Preferably, each of the plurality of holes continuously extends through the first dielectric layer, the ground pattern, the second dielectric layer, the first electric conductor layer, and the second electric conductor layer. The continuously extending through-holes can more reliably prevent the leakage of electromagnetic waves.

(6) Preferably, the electromagnetic wave shield includes at least a first shield disposed around the transmission line and a second shield disposed on an outer peripheral side of the first shield, the first shield includes the ground electric conductor on inner surfaces of a plurality of first holes extending through the first dielectric layer, the ground pattern, the second dielectric layer, the first electric conductor layer, and the second electric conductor layer, the plurality of first holes are a plurality of first elongated holes provided at an interval in a direction in which the transmission line is surrounded, in each of the plurality of first elongated holes, a longitudinal dimension in the direction in which the transmission line is surrounded is larger than a width dimension, the second shield includes, on an outer peripheral side of the plurality of first holes, the ground electric conductor on inner surfaces of a plurality of second holes extending through the first dielectric layer, the ground pattern, the second dielectric layer, the first electric conductor layer, and the second electric conductor layer, the plurality of second holes are a plurality of second elongated holes provided at an interval in a direction in which the transmission line is surrounded, in each of the plurality of second elongated holes, a longitudinal dimension in the direction in which the transmission line is surrounded is larger than a width dimension, and the second shield is arranged so as to shield electromagnetic waves leaking from a gap between the plurality of first elongated holes. In this case, the leakage of electromagnetic waves can be more efficiently prevented.

(7) The high-frequency circuit preferably includes a cover film applied to a surface of at least one of the first electric conductor layer and the second electric conductor layer. In this case, the strength of the high-frequency circuit in which the elongated holes are formed can be ensured by the cover film.

2. Details of Embodiment of Present Disclosure

Hereinafter, in the drawings, the same reference signs denote the same components.

FIGS. 1 to 6 illustrate a high-frequency circuit 10 according to an embodiment. The high-frequency circuit 10 according to the embodiment is configured as a flexible printed circuit (FPC) used for transmitting high-frequency signals. The FPC has a structure in which a conductor such as copper foil is applied to a thin, flexible, insulator base film. The high-frequency circuit 10 is not limited to the FPC and may be a circuit formed on a rigid substrate.

Figure 2:
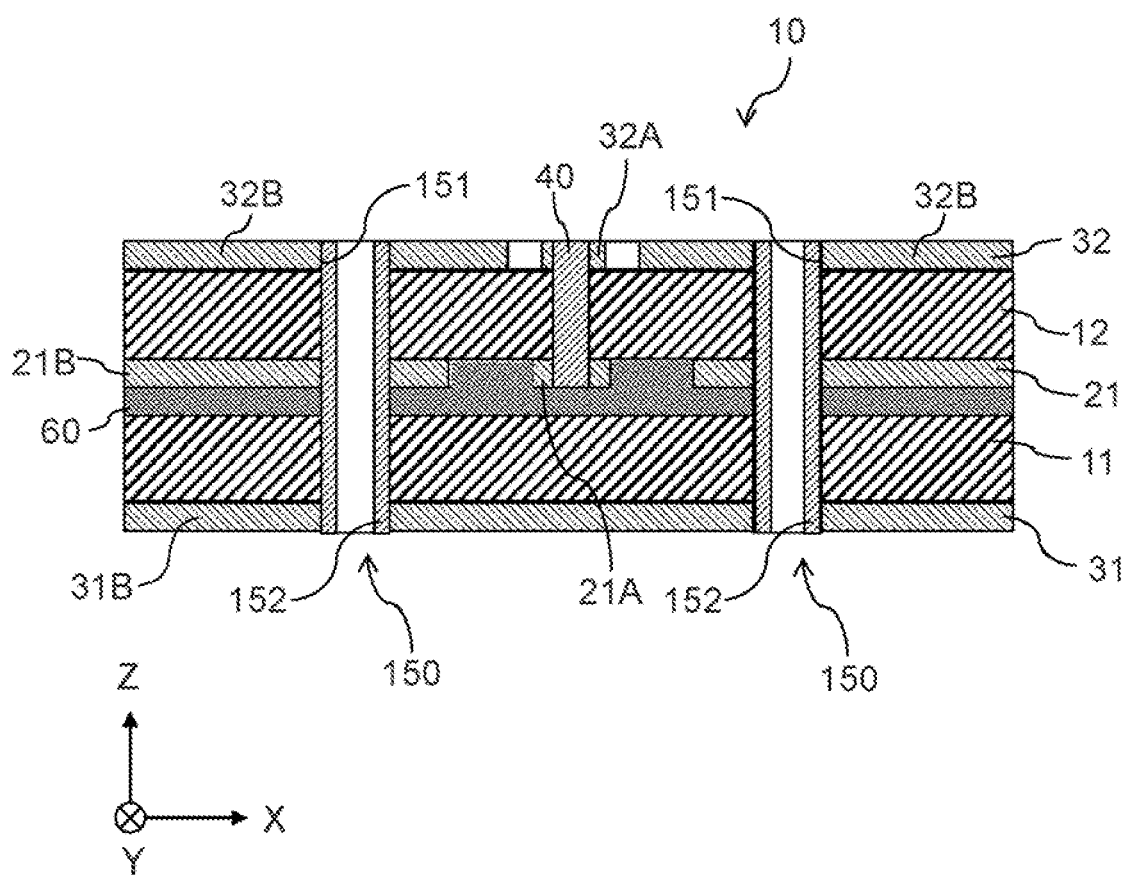
FIG. 2 is a B-B sectional view of FIG. 1.

As illustrated in FIG. 2, the high-frequency circuit 10 according to the embodiment includes a first dielectric layer 11, a circuit layer 21, a second dielectric layer 12, a first electric conductor layer 31, a second electric conductor layer 32, and electromagnetic wave shields 150. The high-frequency circuit 10 according to the embodiment has a multilayer structure having three electric conductor layers. The number of electric conductor layers is not particularly limited and may be 2, 4, 5, or more. In FIG. 2, among the three electric conductor layers, the electric conductor layer disposed at a middle position is the circuit layer 21 having a transmission line 21A of high-frequency waves. The first electric conductor layer 31, which is one of the three electric conductor layers, is disposed on the lower side of FIG. 2, which is one side of the circuit layer 21 in the thickness direction. The second electric conductor layer 32, which is the remaining one of the three electric conductor layers, is disposed on the upper side of FIG. 2, which is the other side of the circuit layer 21 in the thickness direction.

Figure 3:
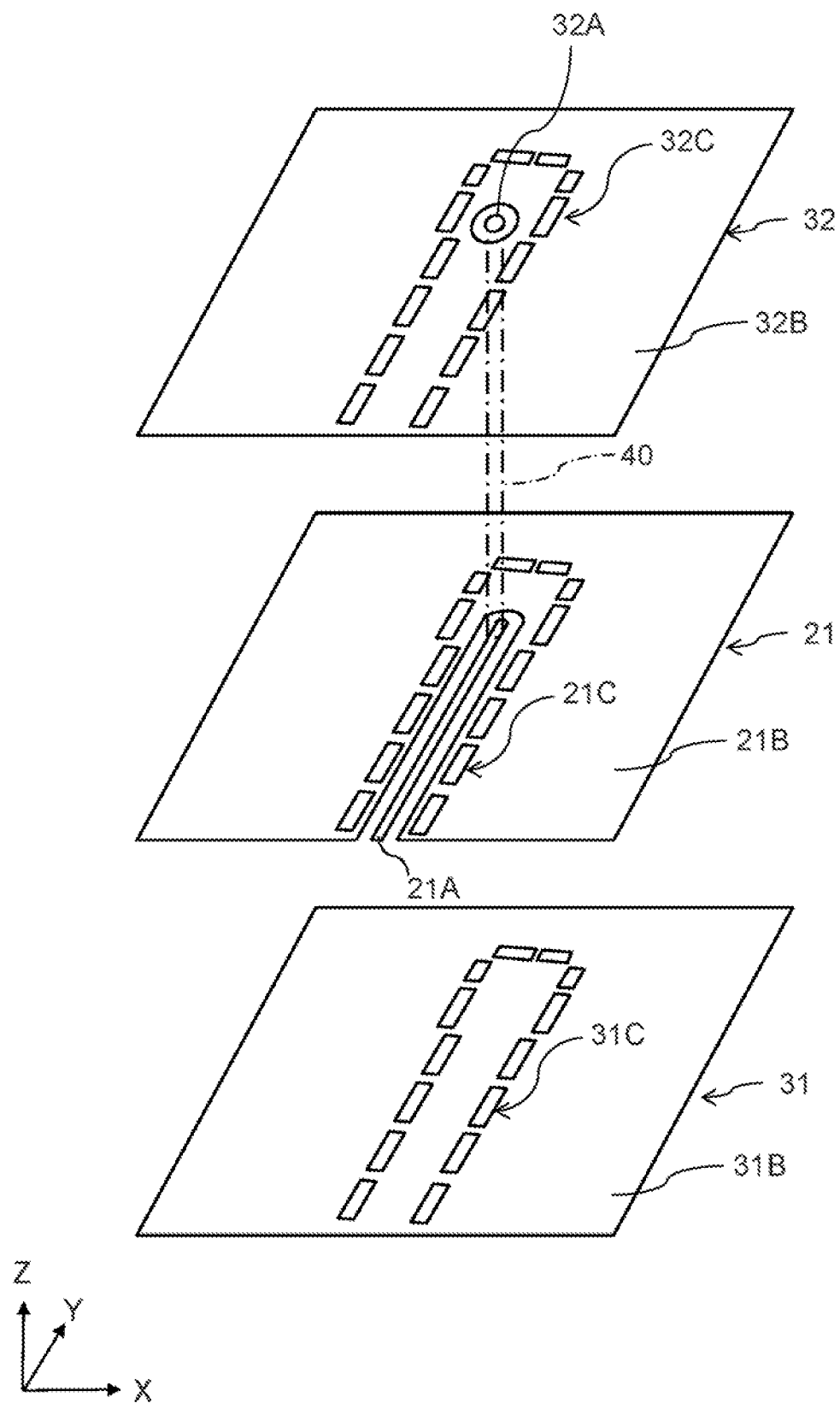
FIG. 3 is an exploded perspective view of a first electric conductor layer, a circuit layer, and a second electric conductor layer.

As illustrated in FIG. 3, the circuit layer 21 has a transmission line 21A and a ground pattern 21B located around the transmission line 21A. The region between the transmission line 21A and the ground pattern 21B is removed by etching, so that the transmission line 21A and the ground pattern 21B are insulated from each other. In FIG. 3, the transmission line 21A is formed linearly, but may be formed in a curved manner. Holes 21C that form part of holes 151 for the electromagnetic wave shields 150 described later are formed around the transmission line 21A.

As illustrated in FIG. 2, the first dielectric layer 11 is disposed between the circuit layer 21 and the first electric conductor layer 31. That is, the circuit layer 21 is disposed on the first dielectric layer 11. In other words, the circuit layer 21 is disposed over the first electric conductor layer 31 with the first dielectric layer 11 therebetween. The circuit layer 21 and the first dielectric layer 11 are bonded to each other with an adhesive 60 therebetween. As illustrated in FIG. 3, substantially the entire surface of the first electric conductor layer 31 is constituted by a ground pattern 31B except for holes 31C that form part of the holes 151 for the electromagnetic wave shields 150 described later. That is, the first electric conductor layer 31 is a ground layer.

The adhesive 60 is preferably an adhesive having good flexibility and heat resistance. The adhesive 60 is, for example, a resin-based adhesive such as a modified polyphenylene ether-based, styrene resin-based, epoxy resin-based, butyral resin-based, or acrylic resin-based adhesive.

A main component of the adhesive 60 is preferably a thermosetting resin. The lower limit of the curing temperature of the thermosetting resin serving as the main component of the adhesive 60 is preferably 120° C., and more preferably 150° C. The upper limit of the curing temperature of the thermosetting resin serving as the main component of the adhesive 60 is preferably 250° C., more preferably 230° C., and still more preferably 200° C. If the curing temperature of the thermosetting resin serving as the main component of the adhesive 60 is higher than the lower limit, the adhesive 60 is easily handled. If the curing temperature of the thermosetting resin serving as the main component of the adhesive 60 is lower than the upper limit, thermal deformation of the layers bonded with the adhesive 60 can be reduced during curing of the adhesive 60. The reduction of thermal deformation can suppress a decrease in the dimensional accuracy of the high-frequency circuit 10.

The lower limit of the relative dielectric constant of the adhesive 60 is preferably as small as possible; however, in reality, the limit is considered to be 1.5 in order to satisfy other conditions such as insulating properties and mechanical strength. The upper limit of the relative dielectric constant of the adhesive 60 is, for example, 3, preferably 2.8, and more preferably 2.6. If the relative dielectric constant of the adhesive 60 is smaller than the upper limit, dielectric loss can be reduced in the case of transmitting high-frequency signals through the high-frequency circuit 10.

As illustrated in FIG. 2, the second dielectric layer 12 is disposed between the circuit layer 21 and the second electric conductor layer 32. That is, the second dielectric layer 12 is disposed such that the circuit layer 21 is located between the first dielectric layer 11 and the second dielectric layer 12. As illustrated in FIG. 3, substantially the entire surface of the second electric conductor layer 32 is constituted by a ground pattern 32B except for a transmission line 32A of high-frequency signals and holes 32C that form part of the holes 151 for the electromagnetic wave shields 150. That is, the second electric conductor layer 32 is a ground layer.

As illustrated in FIG. 2, the first electric conductor layer 31 and the second electric conductor layer 32 that serve as ground layers are disposed on both the upper and lower sides of the circuit layer 21, that is, on both sides in the Z direction of FIG. 2. Accordingly, of electromagnetic waves radiated from the transmission line 21A, electromagnetic waves radiated to both sides of the high-frequency circuit 10 in the thickness direction, that is, to both sides in the Z direction of FIG. 2 are shielded by the first electric conductor layer 31 and the second electric conductor layer 32.

Some of the electromagnetic waves radiated from the transmission line 21A are radiated in the direction parallel to the X-Y plane of FIG. 2. The electromagnetic waves radiated in the direction parallel to the X-Y plane cannot be shielded by the first electric conductor layer 31 and the second electric conductor layer 32 and may leak to the outside of the high-frequency circuit 10 through the first dielectric layer 11 and the second dielectric layer 12. In view of this, the high-frequency circuit 10 according to the embodiment includes the electromagnetic wave shields 150 for shielding electromagnetic waves radiated in the direction parallel to the X-Y plane. Note that the X-Y plane is a plane perpendicular to the thickness direction of the high-frequency circuit 10. The Z direction is the thickness direction of the high-frequency circuit 10 and corresponds to a stacking direction of the aforementioned multilayer structure of the electric conductor layers.

In the high-frequency circuit 10 according to the embodiment, electromagnetic waves radiated in the Z direction are shielded by the first electric conductor layer 31 and the second electric conductor layer 32. Electromagnetic waves radiated in the direction parallel to the X-Y plane are shielded by the electromagnetic wave shields 150. Thus, electromagnetic waves radiated from the transmission line 21A can be effectively prevented from leaking to the outside of the high-frequency circuit 10. As a result, the influence of leaking electromagnetic waves on other peripheral circuits can be reduced.

Figure 1:
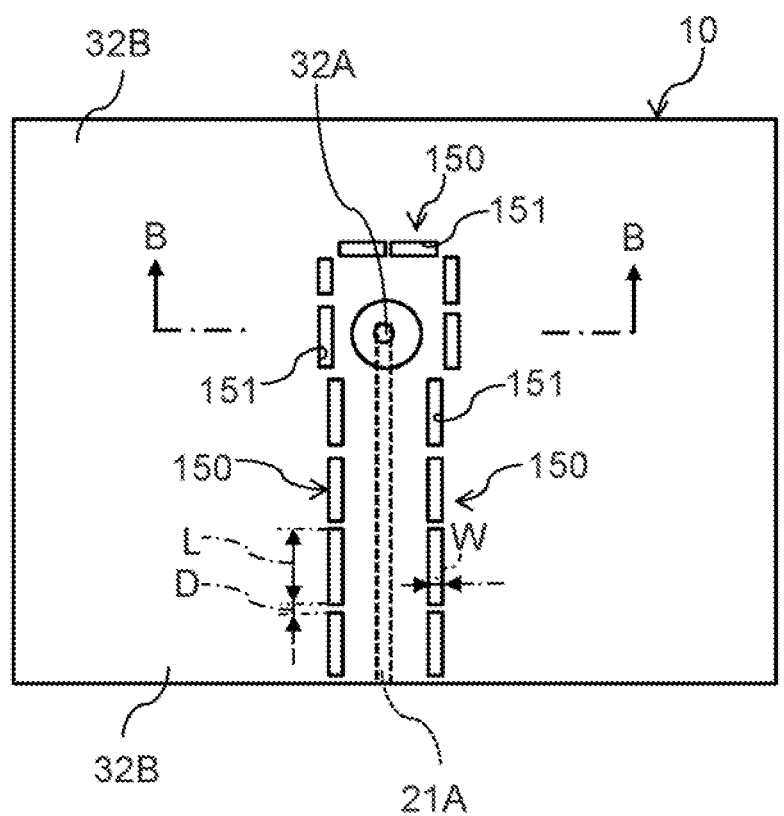
FIG. 1 is a plan view of a high-frequency circuit according to an embodiment.
Figure 1:
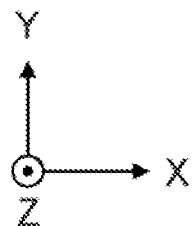

The electromagnetic wave shields 150 are configured to function as a shield wall that shields electromagnetic waves passing through the first dielectric layer 11 and the second dielectric layer 12 around the transmission line 21A. As illustrated in FIG. 1, the electromagnetic wave shields 150 are formed so as to surround the transmission line 21A in plan view. In the embodiment, a plurality of electromagnetic wave shields 150 are disposed at an interval D in a direction in which the transmission line 21A is surrounded.

As illustrated in FIG. 2, the electromagnetic wave shields 150 include ground electric conductors 152 on inner surfaces of the holes 151 extending through the first dielectric layer 11, the ground pattern 21B of the circuit layer 21, the second dielectric layer 12, the first electric conductor layer 31, and the second electric conductor layer 32. In the first electric conductor layer 31 and the second electric conductor layer 32, the ground electric conductors 152 are provided on the inner surfaces of the holes 151 formed in the ground patterns 31B and 32B. Since the ground electric conductors 152 are provided so as to surround the transmission line 21A, they can shield electromagnetic waves passing through the first dielectric layer 11 and the second dielectric layer 12. Incidentally, on the lower side of FIG. 1, the transmission line 21A is not surrounded by the electromagnetic wave shields 150. This is just because, for the convenience of drawing, the illustration of the transmission line 21A is omitted on the lower side of FIG. 1, and the illustration of the electromagnetic wave shields 150 is also omitted accordingly. Therefore, in reality, the electromagnetic wave shields 150 can also surround the lower side of the transmission line 21A.

As illustrated in FIG. 7, it has been a common knowledge that the shield vias 102 in the related art each have a circular shape in plan view. Therefore, to shield leaking electromagnetic waves, it is necessary to densely arrange multiple shield vias 102 so as to surround the signal transmission line 101. In contrast to this, as illustrated in FIG. 1, the electromagnetic wave shields 150 in the embodiment each have a shape elongated in a direction in which the transmission line 21A is surrounded. Specifically, in each of the electromagnetic wave shields 150, a longitudinal dimension L in a direction in which the transmission line 21A is surrounded is larger than a width dimension W. Therefore, leaking electromagnetic waves can be effectively shielded with a smaller number of electromagnetic wave shields 150 than the shield vias 102 having a circular shape.

Figure 4:
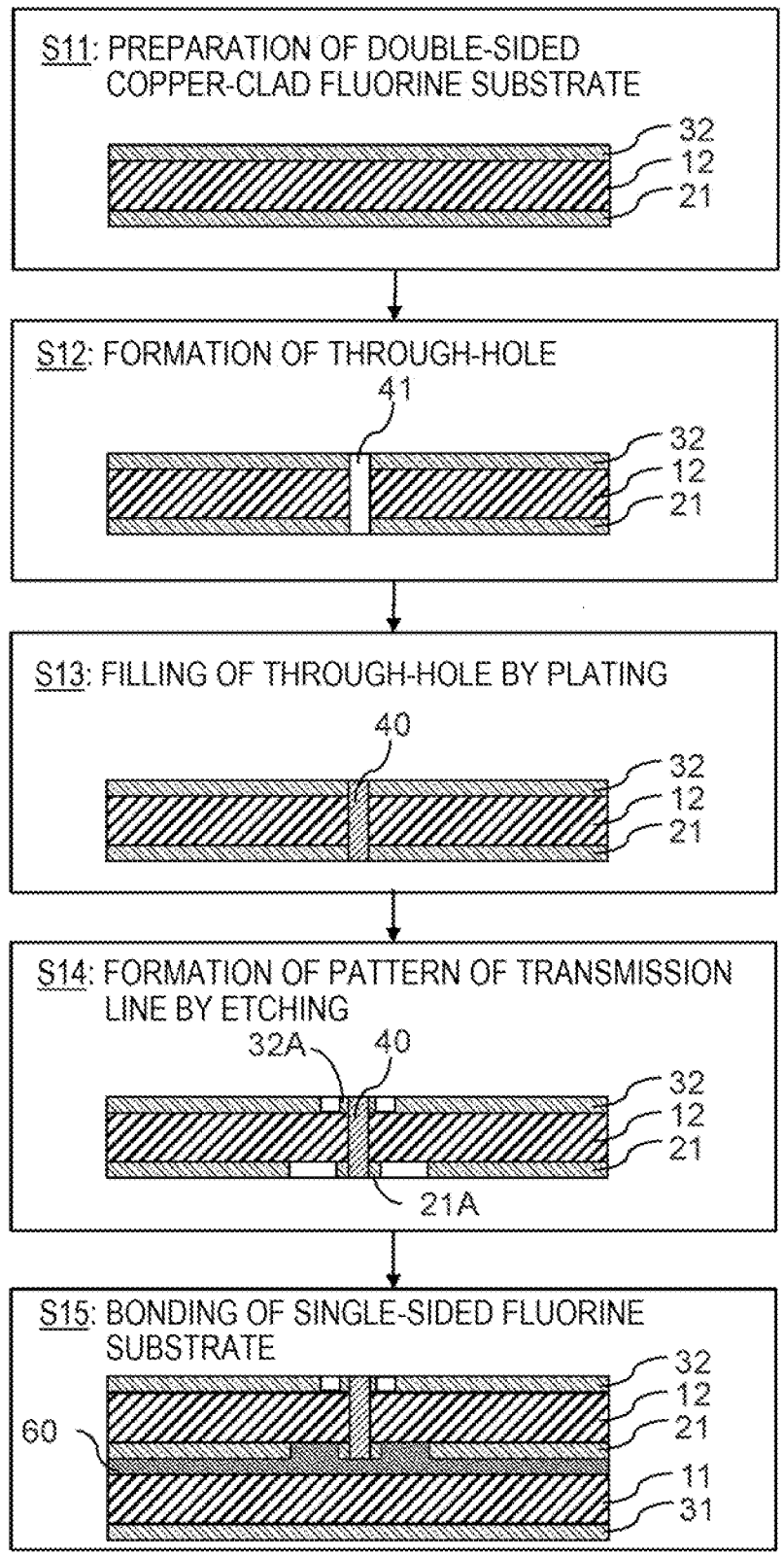
FIG. 4 includes views illustrating the first half of a process of producing the high-frequency circuit according to the embodiment.
Figure 5:
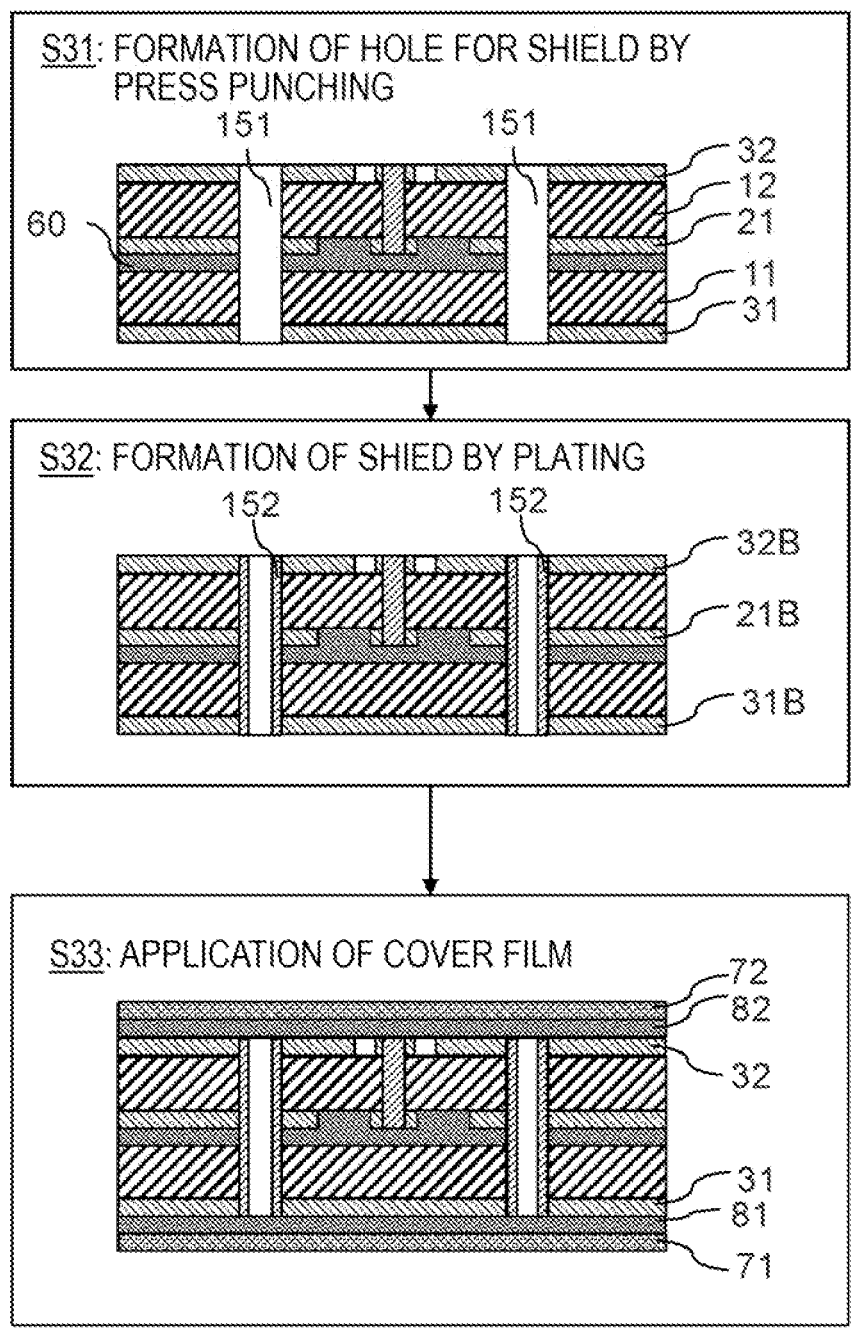
FIG. 5 includes views illustrating the second half of the process of producing the high-frequency circuit according to the embodiment.

FIGS. 4 and 5 illustrate a method for producing the high-frequency circuit 10 according to the embodiment. In step S11 illustrated in FIG. 4, a double-sided copper-clad fluororesin substrate is prepared as one example of a substrate. The double-sided copper-clad fluororesin substrate includes a fluororesin substrate constituting a second dielectric layer 12, copper constituting a circuit layer 21, and copper constituting a second electric conductor layer 32. The material of the substrate is not limited to a fluororesin.

In step S12, a through-hole 41 that extends through the circuit layer 21, the second dielectric layer 12, and the second electric conductor layer 32 is formed at a position of a transmission line 21A and a transmission line 32A.

In step S13, the inside of the through-hole 41 is filled with an electric conductor by plating. Thus, a via 40 that electrically connects the transmission line 21A to the transmission line 32A is formed. The transmission line 32A functions as, for example, an external connection terminal for the transmission line 21A. Incidentally, the surface of the inside of the through-hole 41 may be covered by plating, and the remaining space may be filled with a synthetic resin.

In step S14, the circuit layer 21 and the second electric conductor layer 32 of the double-sided copper-clad fluororesin substrate are subjected to an etching process to form the transmission line 21A of the circuit layer 21 and the transmission line 32A of the second electric conductor layer 32.

In step S15, a single-sided fluororesin substrate is bonded on the circuit layer 21 side. The single-sided fluororesin substrate includes a fluororesin substrate constituting a first dielectric layer 11 and copper constituting a first electric conductor layer 31. In step S15, bonding is performed with an adhesive 60 such that the first dielectric layer 11 and the circuit layer 21 face with each other. The adhesive 60 is, for example, a bonding sheet. The bonding sheet is used for bonding between layers of the substrates. The bonding sheet has insulating properties and adhesiveness.

In step S31 subsequent to step S15, to form electromagnetic wave shields 150, a plurality of holes 151 that continuously extend from the first electric conductor layer 31 to the second electric conductor layer 32 are formed by press punching. The method for forming the holes 151 is not limited to press punching, but the use of press punching is advantageous in that the plurality of holes 151 can be formed at the same time. The holes 151 may be formed by laser processing.

The plurality of holes 151 are provided at an interval D in a direction in which the transmission line 21A are surrounded. Each of the plurality of holes 151 has a longitudinal dimension L in the direction in which the transmission line 21A is surrounded and a width dimension W orthogonal to the direction of the longitudinal dimension L. Each of the plurality of holes 151 is an elongated hole. That is, each of the plurality of holes 151 has a longitudinal dimension L larger than the width dimension W. The longitudinal dimension L is preferably more than 5 times larger than the width dimension W, more preferably more than 10 times larger than the width dimension W, still more preferably more than 15 times larger than the width dimension W, and still more preferably more than 20 times larger than the width dimension W. By making the longitudinal dimension L sufficiently larger than the width dimension W, the number of the holes 151 can be reduced. Furthermore, by making the width dimension W sufficiently smaller than the longitudinal dimension L, the area of a region necessary for forming the electromagnetic wave shields 150 around the transmission line 21A can be reduced.

The longitudinal dimension L is larger than the interval D. The longitudinal dimension L is preferably more than 5 times larger than the interval D, preferably more than 10 times larger than the interval D, preferably more than 15 times larger than the interval D, and still more preferably more than 20 times larger than the interval D. To reduce the leakage of electromagnetic waves in the interval D, the interval D is preferably smaller than $1/4$ of a wavelength $\lambda$ of high-frequency waves transmitted by the transmission line 21A, more preferably smaller than $1/8$ of the wavelength $\lambda$, and still more preferably smaller than $1/16$ of the wavelength $\lambda$. As the interval D is decreased, the leakage of electromagnetic waves can be further reduced. By making the interval D smaller than $1/16$ of the wavelength $\lambda$, the leakage of electromagnetic waves can be sufficiently reduced.

Since the interval D is provided between the pluralities of holes 151, the decrease in the strength of the high-frequency circuit 10 can be suppressed compared with the case where a single hole 151 having a long length is continuously formed.

As the width dimension W is increased, the thickness of each of the electromagnetic wave shields 150 increases, and thus the interval D that is allowable increases. That is, when the width dimension W is increased, the leakage of electromagnetic waves can be reduced even in the case where the interval D between the pluralities of holes 151 is the same.

In step S32, electric conductors 152 are formed on the inner surfaces of the holes 151 by plating. FIG. 2 illustrates a case where the electric conductors 152 are disposed in contact with the entire inner surfaces of the holes 151, and the electric conductors 152 are each formed into a tubular shape having an outer peripheral shape corresponding to the inner peripheral shape of a hole 151. The electric conductors 152 may be formed only on the inner surfaces of the holes 151 or may be formed so as to completely fill the inside of the holes 151. The insides of the electric conductors 152 may be filled with a dielectric substance such as a synthetic resin or may be filled with an electric conductor such as a conductive paste.

The electric conductors 152 electrically connect the ground pattern 21B, the ground pattern 31B, and the ground pattern 32B together. Accordingly, the electric conductors 152 are ground electric conductors 152. The ground electric conductors 152 are provided inside the respective plurality of holes 151 surrounding the periphery of the transmission line 21A. Therefore, the plurality of ground electric conductors 152 formed in the plurality of holes 151 function as the electromagnetic wave shields 150 surrounding the periphery of the transmission line 21A. The ground electric conductors 152 can shield electromagnetic waves radiated through the first dielectric layer 11 and the second dielectric layer 12.

That is, the electric conductors 152 electrically connect the ground pattern 21B of the circuit layer 21 to the ground pattern 31B of the first electric conductor layer 31. Accordingly, the electric conductors 152 have an electric potential equal to that of the ground patterns 21B and 31B and thus serve as ground electric conductors 152. Since the ground electric conductors 152 are disposed in the holes 151 surrounding the periphery of the transmission line 21A, they function as the electromagnetic wave shields 150 surrounding the periphery of the transmission line 21A. The ground electric conductors 152 located in the first dielectric layer 11 can shield electromagnetic waves radiated through the first dielectric layer 11.

The electric conductors 152 electrically connect the ground pattern 21B of the circuit layer 21 to the ground pattern 32B of the second electric conductor layer 32. Accordingly, the electric conductors 152 have an electric potential equal to that of the ground patterns 21B and 32B and thus serve as ground electric conductors 152. Since the ground electric conductors 152 are disposed in the holes 151 surrounding the periphery of the transmission line 21A, they function as the electromagnetic wave shields 150 surrounding the periphery of the transmission line 21A. The ground electric conductors 152 located in the second dielectric layer 12 can shield electromagnetic waves radiated through the second dielectric layer 12.

In step S33, cover films 71 and 72 are applied to the surfaces of the first electric conductor layer 31 and the second electric conductor layer 32 with adhesives 81 and 82, respectively, therebetween. The cover films 71 and 72 are composed of, for example, a polyimide, and protect the first electric conductor layer 31 and the second electric conductor layer 32, respectively. The application of the cover films 71 and 72 can ensure the strength of the high-frequency circuit 10 in which the holes 151 are formed.

Figure 6:
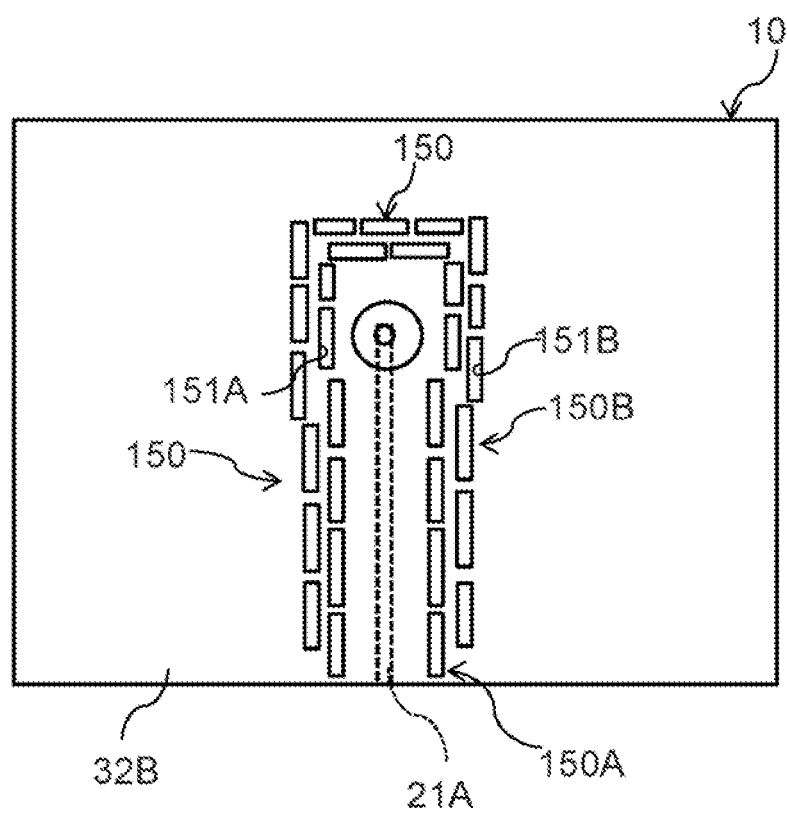
FIG. 6 is a plan view illustrating a modification of the high-frequency circuit.
Figure 6:
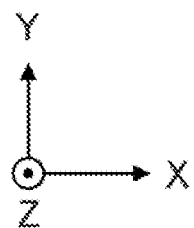

The plurality of electromagnetic wave shields 150 and holes 151 illustrated in FIG. 1 are formed around the transmission line 21A so as to surround in one line, but may be formed so as to surround in a plurality of lines, as illustrated in FIG. 6. FIG. 6 illustrates a case where a plurality of electromagnetic wave shields 150 and holes 151 are arranged in two lines on the inner and outer sides.

Specifically, electromagnetic wave shields 150 illustrated in FIG. 6 include first shields 150A disposed around a transmission line 21A and second shields 150B disposed on the outer peripheral side of the first shields 150A. Other shields may be further provided on the outer peripheral side of the second shields 150B.

The first shields 150A include ground electric conductors 152 on inner surfaces of a plurality of first holes 151A that continuously extend from the first electric conductor layer 31 to the second electric conductor layer 32, as in the holes 151. Similarly to the holes 151, the plurality of first holes 151A are each an elongated hole and may be herein referred to as first elongated holes. A line formed of the plurality of first holes 151A constitutes a first line arranged at intervals in a direction in which the periphery of the transmission line 21A is surrounded. In each of the plurality of first elongated holes 151A, a longitudinal dimension L in the direction in which the transmission line 21A is surrounded is larger than a width dimension W, as in the holes 151.

The second shields 150B include ground electric conductors 152 on inner surfaces of a plurality of second holes 151B that continuously extend from the first electric conductor layer 31 to the second electric conductor layer 32, as in the holes 151. Similarly to the holes 151, the plurality of second holes 151B are each an elongated hole and may be herein referred to as second elongated holes. A line formed of the plurality of second holes 151B constitutes, on the outer peripheral side of the plurality of the first elongated holes 151A, a second line arranged at intervals in the direction in which the periphery of the transmission line 21A is surrounded. In each of the plurality of second elongated holes 151B, a longitudinal dimension L in the direction in which the transmission line 21A is surrounded is larger than a width dimension W, as in the holes 151.

The second elongated holes 151B are arranged so as to be located at positions corresponding to gaps between the first elongated holes 151A. That is, the second elongated holes 151B are arranged so as to cover the gaps between the first elongated holes 151A from the outer peripheral side of the first elongated holes 151A. Accordingly, the second shields 150B constituted by the ground electric conductors 152 in the second elongated holes 151B can shield electromagnetic waves leaking from the gaps between the first shields 150A. In this manner, in FIG. 6, the line of the second shields 150B serving as outer electromagnetic wave shields are arranged so as to shield electromagnetic waves leaking from the line of the first shields 150A serving as inner electromagnetic wave shields. The arrangement of the electromagnetic wave shields 150 in a plurality of lines enables leaking electromagnetic waves to be efficiently shielded. In addition, since the first holes 151A and the second holes 151B are elongated holes, they can efficiently shield leaking electromagnetic waves even in a small number of lines.

It is to be understood that the embodiment disclosed herein is only illustrative and non-restrictive in all respects. The scope of the present invention is defined not by the meaning described above but by the claims, and is intended to include meaning equivalents to the scope of the claims and all modifications within the scope of the claims.

REFERENCE SIGNS LIST

10: high-frequency circuit
11: first dielectric layer
12: second dielectric layer
21: circuit layer
21A: transmission line
21B: ground pattern
21C: hole
31: first electric conductor layer
31C: hole
31B: ground pattern
32: second electric conductor layer
32A: transmission line
32B: ground pattern
32C: hole
40: via
41: through-hole
60: adhesive
71: cover film
72: cover film
81: adhesive
82: adhesive
100: high-frequency circuit
101: signal transmission line
102: shield via
150: electromagnetic wave shield
150A: first shield
150B: second shield
151: hole
151A: first hole, first elongated hole
151B: second hole, second elongated hole
152: electric conductor, ground electric conductor
L: longitudinal dimension
W: width dimension
D: interval

The invention claimed is:

1. A high-frequency circuit comprising:
a first dielectric layer;
a circuit layer disposed on the first dielectric layer and including a first transmission line of a high-frequency signal and a ground pattern disposed around the first transmission line;
a second dielectric layer disposed such that the circuit layer is located between the first dielectric layer and the second dielectric layer;
a first electric conductor layer disposed such that the first dielectric layer is located between the circuit layer and the first electric conductor layer;
an adhesive that bonds the circuit layer and the first dielectric layer to each other;
a second electric conductor layer disposed such that the second dielectric layer is located between the circuit layer and the second electric conductor layer; and an electromagnetic wave shield disposed around the first transmission line, wherein the second electric conductor layer includes a second transmission line, the second transmission line is electrically connected to the first transmission line and is an external connection terminal for the first transmission line, the electromagnetic wave shield includes a ground electric conductor on inner surfaces of a plurality of holes continuously extending through the first dielectric layer, the ground pattern, the second dielectric layer, the first electric conductor layer, and the second electric conductor layer, the plurality of holes are a plurality of elongated holes spaced apart by an interval between edges of the holes in a direction in which the first transmission line is surrounded, and in each of the plurality of elongated holes, a longitudinal dimension in the direction in which the first transmission line is surrounded is larger than a width dimension.

2. The high-frequency circuit according to claim 1, wherein the longitudinal dimension is more than five times larger than the width dimension.

3. The high-frequency circuit according to claim 1, wherein the longitudinal dimension is larger than the interval.

4. The high-frequency circuit according to claim 3, wherein the longitudinal dimension is more than five times larger than the interval.

5. The high-frequency circuit according to claim 1, wherein the electromagnetic wave shield includes at least a first shield disposed around the first transmission line and a second shield disposed on an outer peripheral side of the first shield, the first shield includes the ground electric conductor on inner surfaces of a plurality of first holes extending through the first dielectric layer, the ground pattern, the second dielectric layer, the first electric conductor layer, and the second electric conductor layer, the plurality of first holes are a plurality of first elongated holes provided at an interval in a direction in which the first transmission line is surrounded, in each of the plurality of first elongated holes, a longitudinal dimension in the direction in which the first transmission line is surrounded is larger than a width dimension, the second shield includes, on an outer peripheral side of the plurality of first holes, the ground electric conductor on inner surfaces of a plurality of second holes extending through the first dielectric layer, the ground pattern, the second dielectric layer, the first electric conductor layer, and the second electric conductor layer, the plurality of second holes are a plurality of second elongated holes provided at an interval in a direction in which the first transmission line is surrounded, in each of the plurality of second elongated holes, a longitudinal dimension in the direction in which the first transmission line is surrounded is larger than a width dimension, and the second shield is arranged so as to shield electromagnetic waves leaking from a gap between the plurality of first elongated holes.

6. The high-frequency circuit according to claim 1, further comprising:

a cover film applied to a surface of at least one of the first electric conductor layer and the second electric conductor layer.

7. The high-frequency circuit according to claim 1, wherein the first transmission line is surrounded by electromagnetic wave shields on four sides in a plan view.

8. The high-frequency circuit according to claim 1, wherein the adhesive is between side edges of the first transmission line and side edges of the ground pattern.

9. The high-frequency circuit according to claim 1, wherein the interval is smaller than ¼ of a wavelength of high-frequency waves transmitted by the first transmission line.

10. The high-frequency circuit according to claim 1, wherein the interval is smaller than ⅛ of a wavelength of high-frequency waves transmitted by the first transmission line.

11. A high-frequency circuit comprising:

a first dielectric layer;

a circuit layer disposed on the first dielectric layer and including a first transmission line of a high-frequency signal and a ground pattern disposed around the first transmission line;

a second dielectric layer disposed such that the circuit layer is located between the first dielectric layer and the second dielectric layer;

a first electric conductor layer disposed such that the first dielectric layer is located between the circuit layer and the first electric conductor layer;

a second electric conductor layer disposed such that the second dielectric layer is located between the circuit layer and the second electric conductor layer; and an electromagnetic wave shield disposed around the first transmission line, wherein the second electric conductor layer includes a second transmission line, the second transmission line is electrically connected to the first transmission line and is an external connection terminal for the first transmission line, the electromagnetic wave shield includes a ground electric conductor on inner surfaces of a plurality of holes continuously extending through the first dielectric layer, the ground pattern, the second dielectric layer, the first electric conductor layer, and the second electric conductor layer, the plurality of holes are a plurality of elongated holes spaced apart by an interval between edges of the holes in a direction in which the first transmission line is surrounded, in each of the plurality of elongated holes, a longitudinal dimension in the direction in which the first transmission line is surrounded is larger than a width dimension, and the longitudinal dimension of the holes is larger than the interval between holes.

12. The high-frequency circuit according to claim 11, wherein the interval is smaller than ¼ of the wavelength of high-frequency waves transmitted by the first transmission line.

13. The high-frequency circuit according to claim 11, wherein the interval is smaller than ⅛ of the wavelength of high-frequency waves transmitted by the first transmission line.

* * * * *